United States Patent [19]
Shinada

[11] Patent Number: 6,002,609
[45] Date of Patent: Dec. 14, 1999

[54] SEMICONDUCTOR DEVICE HAVING A SECURITY CIRCUIT FOR PREVENTING ILLEGAL ACCESS

[75] Inventor: Kazuyoshi Shinada, Yokohama, Japan

[73] Assignee: Kabushiki Kaisha Toshiba, Kawasaki, Japan

[21] Appl. No.: 09/111,484

[22] Filed: Jul. 8, 1998

[30] Foreign Application Priority Data

Jul. 9, 1997 [JP] Japan .................................... 9-183777

[51] Int. Cl.$^6$ ............................. G11C 16/04; G11C 7/00; G11C 29/00
[52] U.S. Cl. .................... 365/185.04; 365/201; 365/226; 371/21.1; 711/163
[58] Field of Search ............................... 365/185.04, 201, 365/226, 94, 103, 104; 371/21.1; 711/163

[56] References Cited

U.S. PATENT DOCUMENTS

| | | | |
|---|---|---|---|
| 4,268,911 | 5/1981 | Bell | 365/104 |
| 5,175,840 | 12/1992 | Sawase | 365/201 |
| 5,237,531 | 8/1993 | Okano et al. | 365/94 |
| 5,465,341 | 11/1995 | Doi et al. | 365/201 |
| 5,576,988 | 11/1996 | Kuo et al. | 365/185.04 |
| 5,640,347 | 6/1997 | Lin et al. | 365/185.04 |
| 5,642,480 | 6/1997 | Brownlee et al. | 365/201 |

*Primary Examiner*—Trong Phan
*Attorney, Agent, or Firm*—Finnegan, Henderson, Farabow, Garrett & Dunner, L.L.P.

[57] ABSTRACT

A testing pad is connected to an EEPROM through a wiring layer of a security circuit and a test circuit, while a testing pad is connected to the EEPROM through a wiring different from the wiring layer and the test circuit. A polysilicon pattern is connected to the wiring layer, and an n-type diffusion region is connected to the wiring. A tunnel insulation film having a thickness of about 100 Å is formed between the polysilicon pattern and the n-type diffusion region. After a test for the function and stored information of the EEPROM is completed, a voltage, which is not lower than a predetermined voltage applied during the test, is applied between the testing pads to break the tunnel insulation film, thereby making the polysilicon pattern and n-type diffusion region conductive.

28 Claims, 4 Drawing Sheets

SEMICONDUCTOR DEVICE HAVING A SECURITY CIRCUIT FOR PREVENTING ILLEGAL ACCESS

BACKGROUND OF THE INVENTION

The present invention relates to a semiconductor device mounted on an IC card and, more particularly, to a semiconductor device having a security circuit for preventing illegal access to the device.

An IC card incorporating a semiconductor device (hereinafter referred to as a chip) has recently been popularized rapidly. In a financial world, the demand for such a card is growing to use it as an electronic wallet in which user's information such as an ID number and a balance is recorded.

A semiconductor circuit is formed in the chip of the IC card. The chip includes circuit blocks of a microprocessor (MPU) and a semiconductor memory such as an EEPROM, a ROM and a RAM. The information such as the user's ID number and balance is read out of the semiconductor memory, chiefly the EEPROM through the MPU or it is written thereto. The IC card is operated as an electronic wallet by reading/writing such information from/to the chip.

The above-described chip is usually provided with a test circuit for testing the EEPROM storing the information and a test pad connected to the test circuit. Using the test pad, the circuit operation and stored information of the EEPROM are tested.

Since, however, information can be read out of/written to the EEPROM relatively easily using the test pad, it is likely that security information such as an ID number and a balance, stored in the EEPROM, will be illegally decrypted or written through the test pad. Such an illegality may cause great damage to a user or make problems.

BRIEF SUMMARY OF THE INVENTION

It is accordingly an object of the present invention to provide a semiconductor device capable of preventing information from being illegally read from and written to a semiconductor memory using a test circuit after a test for the function and stored information of the semiconductor memory is completed.

To attain the above object, according to a first aspect of the present invention, there is provided a semiconductor device comprising a semiconductor memory having a function of storing information, test means for reading/writing information from/to the semiconductor memory to test a function and stored information of the semiconductor memory, a power supply voltage applying wire for applying a power supply voltage to the semiconductor memory and the test means, a reference voltage applying wire for applying a reference voltage to the semiconductor memory and the test means, and security means interposed between the power supply voltage applying wire and the reference voltage applying wire, for breaking tunnel insulation film and shortening the power supply voltage applying wire and the reference voltage applying wire when a voltage applied between the power supply voltage applying wire and the reference voltage applying wire is not lower than a predetermined voltage.

In the semiconductor device so constituted, a voltage, which is not lower than a predetermined voltage applied during the test, is applied between the power supply voltage applying wire and reference voltage applying wire after a test for the function and stored information of the semiconductor memory is completed. Thus, the power supply voltage applying wire and reference voltage applying wire shortens in the security means, with the result that information can be prevented from being illegally read from/written to the semiconductor memory using the test means.

According to a second aspect of the present invention, there is provided a semiconductor device comprising a semiconductor memory having a function of storing information, test means for reading/writing information from/to the semiconductor memory to test a function and stored information of the semiconductor memory, a power supply voltage applying wire for applying a power supply voltage to the semiconductor memory and the test means, a reference voltage applying wire for applying a reference voltage to the semiconductor memory and the test means, and security means having a tunnel insulation film between the power supply voltage applying wire and the reference voltage applying wire, for breaking the tunnel insulation film and shortening the power supply voltage applying wire and the reference voltage applying wire when a voltage applied between the power supply voltage applying wire and the reference voltage applying wire is not lower than a predetermined voltage.

In the semiconductor device so constituted, a voltage, which is not lower than a predetermined voltage applied during the test, is applied to the tunnel insulation film provided between the power supply voltage applying wire and reference voltage applying wire after a test for the function and stored information of the semiconductor memory is completed. Therefore, in the security means, the tunnel insulation film is broken to make the power supply voltage applying wire and reference voltage applying wire conductive, with the result that information can be prevented from being illegally read from/written to the semiconductor memory using the test means.

According to a third aspect of the present invention, there is provided a semiconductor device comprising a semiconductor memory having a function of storing information, a test circuit for reading/writing information from/to the semiconductor memory to test a function and stored information of the semiconductor memory, a first terminal to which a power supply voltage is applied from outside, a power supply voltage applying wire connected to the first terminal, for applying the power supply voltage to the semiconductor memory and the test circuit, a second terminal to which a reference voltage is applied from outside, a reference voltage applying wire connected to the second terminal, for applying a reference voltage to the semiconductor memory and the test circuit, and a security circuit interposed between the power supply voltage applying wire and the reference voltage applying wire, for shortening the power supply voltage applying wire and the reference voltage applying wire when a voltage applied between the power supply voltage applying wire and the reference voltage applying wire is not lower than a predetermined voltage.

In the semiconductor device so constituted, a voltage, which is not lower than a predetermined voltage applied during the test, is applied between the power supply voltage applying wire and reference voltage applying wire after a test for the function and stored information of the semiconductor memory is completed. Thus, the power supply voltage applying wire and reference voltage applying wire are shorten in the security circuit, with the result that information can be prevented from being illegally read from and written to the semiconductor memory using the test circuit.

According to a fourth aspect of the present invention, there is provided a semiconductor device comprising a semiconductor memory having a function of storing information, a test circuit for reading/writing information from/to the semiconductor memory to test a function and stored information of the semiconductor memory, a first terminal to which a power supply voltage is applied from outside, a power supply voltage applying wire connected to the first terminal, for applying the power supply voltage to the semiconductor memory and the test circuit, a second terminal to which a reference voltage is applied from outside, a reference voltage applying wire connected to the second terminal, for applying a reference voltage to the semiconductor memory and the test circuit, and a security circuit having a tunnel insulation film between the power supply voltage applying wire and the reference voltage applying wire, for breaking the tunnel insulation film and shortening the power supply voltage applying wire and the reference voltage applying wire when a voltage applied between the power supply voltage applying wire and the reference voltage applying wire is not lower than a predetermined voltage.

In the semiconductor device so constituted, a voltage, which is not lower than a predetermined voltage applied during the test, is applied to the tunnel insulation film provided between the power supply voltage applying wire and reference voltage applying wire after a test for the function and stored information of the semiconductor memory is completed. Therefore, in the security circuit, the tunnel insulation film is broken to make the power supply voltage applying wire and reference voltage applying wire conductive, with the result that information can be prevented from being illegally read from and written to the semiconductor memory using the test circuit.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

An embodiment of the present invention will now be described with reference to the accompanying drawings.

First an IC card mounted with a semiconductor device (chip) according to the embodiment of the present invention will be described.

Figure 1:
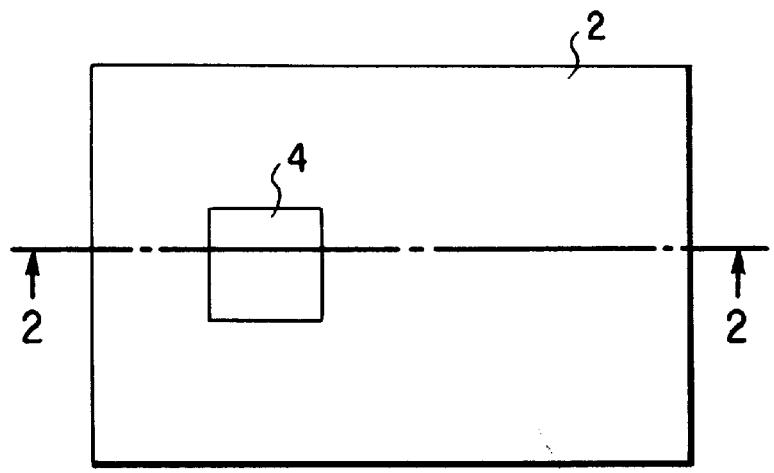
FIG. 1 is a plan view of an IC card mounted with a semiconductor device (chip) according to an embodiment of the present invention.
Figure 2:
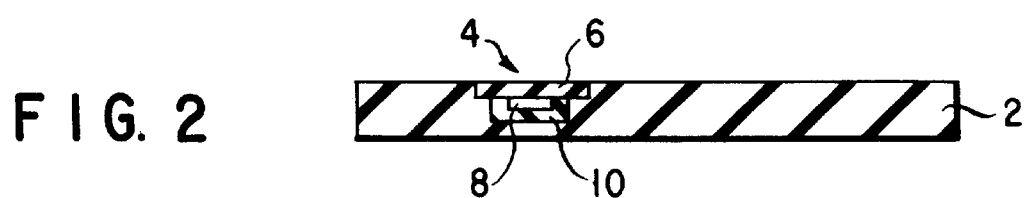
FIG. 2 is a cross-sectional view of the IC card taken along line 2—2 of FIG. 1.

FIG. 1 is a plan view of the IC card, and FIG. 2 is a cross-sectional view of the IC card taken along line 2—2 of FIG. 1.

As illustrated in FIG. 1, the IC card is constituted of a card case 2 showing its outward appearance and an IC package 4 buried into the card case 2. The card case 2 is a flat plate made of resin and the like.

As shown in FIG. 2, a chip 8 is arranged on one face of a printed board 6 of the IC package 4, and the chip 8 is covered completely with resin 10 and fixed onto the printed board 6. A terminal for inputting/outputting information to/from an external device is formed on the other face of the printed board 6.

Figure 3:
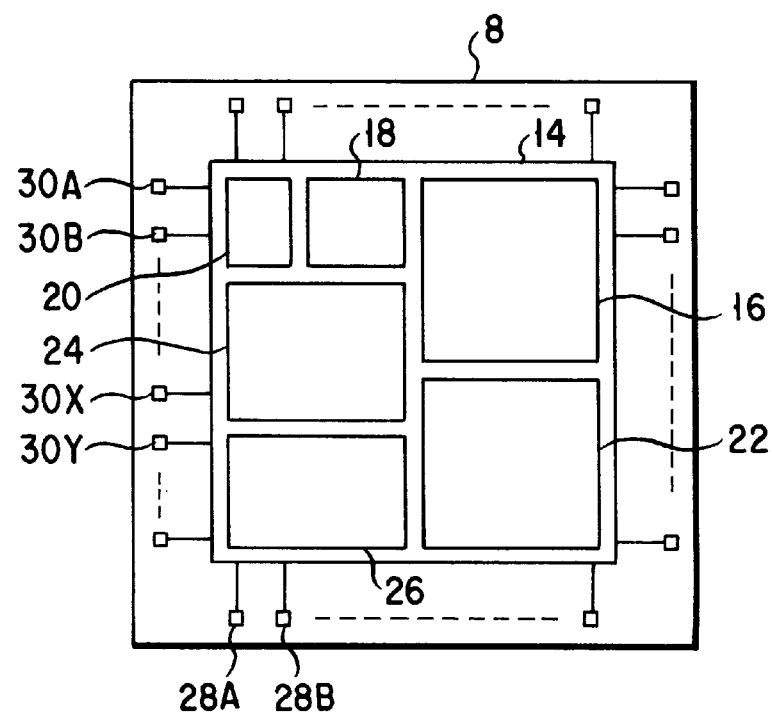
FIG. 3 is a plan view of the constitution of the chip shown in FIG. 1.

The constitution of the chip 8 will now be described. FIG. 3 is a plan view of the constitution of the chip 8.

The chip 8 includes an integrated circuit section 14 having an EEPROM 16, a test circuit 18, a security circuit 20, an MPU 22 for performing an operation, a ROM 24 for storing fixed information, and a RAM 26 for storing temporarily information.

The test circuit 18 is used chiefly to test a function of the EEPROM 16 and information stored therein. The security circuit is capable of shortening between a wire for applying a power supply voltage VDD to the EEPROM 16 and test circuit 18 and a wire for applying a reference voltage VSS after the test for the function and information of the EEPROM 16 is finished. The shortening disables the test circuit 18 from operating thereby to prevent information from being illegally read out of the EEPROM 16 or written thereto.

The chip 8 includes mounting pads 28A, 28B, . . . and testing pads 30A, 30B, . . . , 30X, 30Y, . . . outside the integrated circuit section 14. The mounting pads operate the chip 8 when the IC card is used, while the testing pads operate the test circuit 18.

Figure 4:
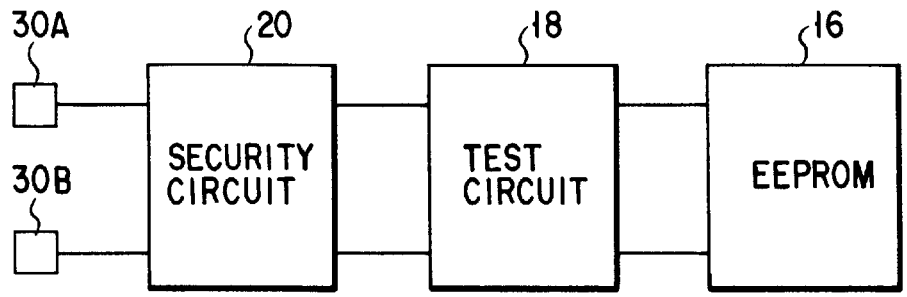
FIG. 4 is a block diagram of the electrical arrangement of a security circuit, a test circuit and an EEPROM of the chip shown in FIG. 1.

FIG. 4 is a block diagram showing the electrical structure of the security circuit 20, test circuit 18 and EEPROM 16.

Referring to FIG. 4, the testing pad 30A is connected to an input section of power supply voltage of the test circuit 18 through the security circuit 20, and an output section of power supply voltage of the test circuit 18 is connected to an input section of power supply voltage of the EEPROM 16. A power supply voltage is input to the testing pad 30A and then applied to the security circuit 20, test circuit 18 and EEPROM 16.

The testing pad 30B is connected to an input section of reference voltage VSS of the test circuit 18 through the security circuit 20, and an output section of reference voltage VSS of the test circuit 18 is connected to an input section of reference voltage VSS of the EEPROM 16. A reference voltage VSS is input to the testing pad 30B and then applied to the security circuit 20, test circuit 18 and EEPROM 16.

Figure 5:
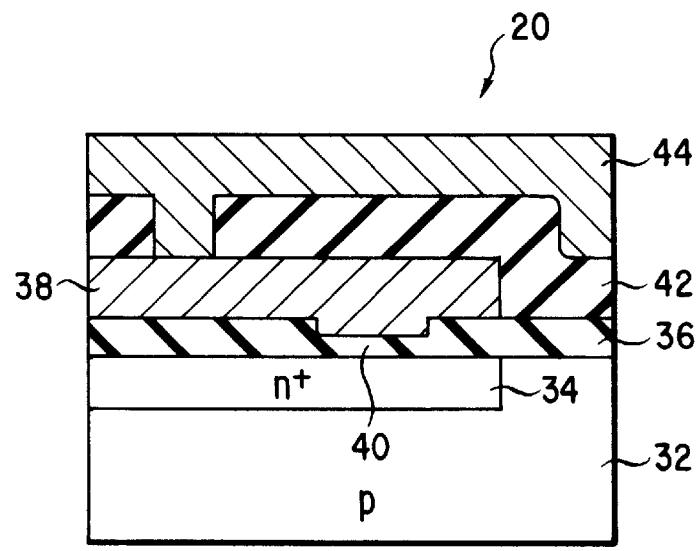
FIG. 5 is a cross-sectional view illustrating the structure of the security circuit.

The constitution of the security circuit 20 will now be described. FIG. 5 is a cross-sectional view of the constitution of the security circuit 20.

As illustrated in FIG. 5, an n-type diffusion region 34 is formed in a p-type Si semiconductor substrate 32. An insulation film 36 having a thickness of about 400 Å, which is used in a high voltage MOS transistor, is formed on the n-type diffusion region 34. Moreover, a polysilicon pattern 38 is formed on the insulation film 36. A tunnel insulation film 40 is formed on part of the insulation film 36. The tunnel insulation film 40 has a thickness of about 100 Å. The insulation film 36 and tunnel insulation film 40 are formed of an oxide film, an oxynitride film, and the like. Furthermore, an interlayer insulation film 42 is formed on the polysilicon pattern 38, and a wiring layer 44 of aluminum and the like is formed thereon.

Figure 6:
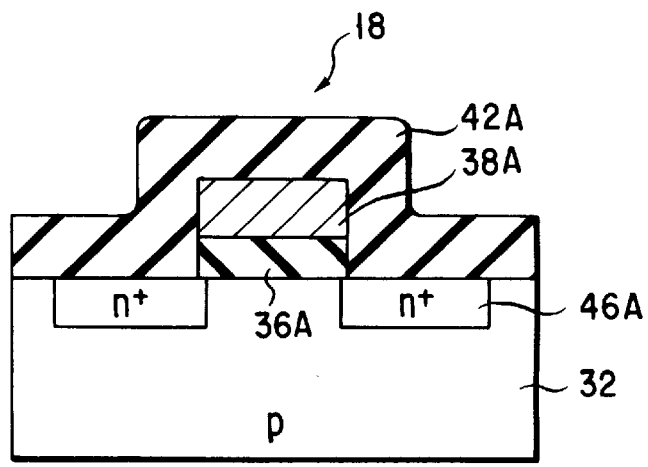
FIG. 6 is a cross-sectional view illustrating the structure of the test circuit.

The constitution of the test circuit 18 will now be described. This circuit is constituted mainly of a buffer. FIG. 6 is a cross-sectional view simply showing the structure of the buffer.

As illustrated in FIG. 6, n-type diffusion regions 46A serving as source and drain regions are formed in a p-type Si semiconductor substrate 32. A gate insulation film 36A having a thickness of about 200 Å, which is used in a 5V MOS transistor, is formed between the source and drain regions. Furthermore, a gate electrode 38A of polysilicon pattern is formed on the gate insulation film 36A. An interlayer insulation film 42A is formed as the uppermost one. The gate insulation film 36A is constituted of an oxide film.

The constitution of the EEPROM 16 will now be described. The EEPROM 16 includes a vast number of memory cells.

Figure 7:
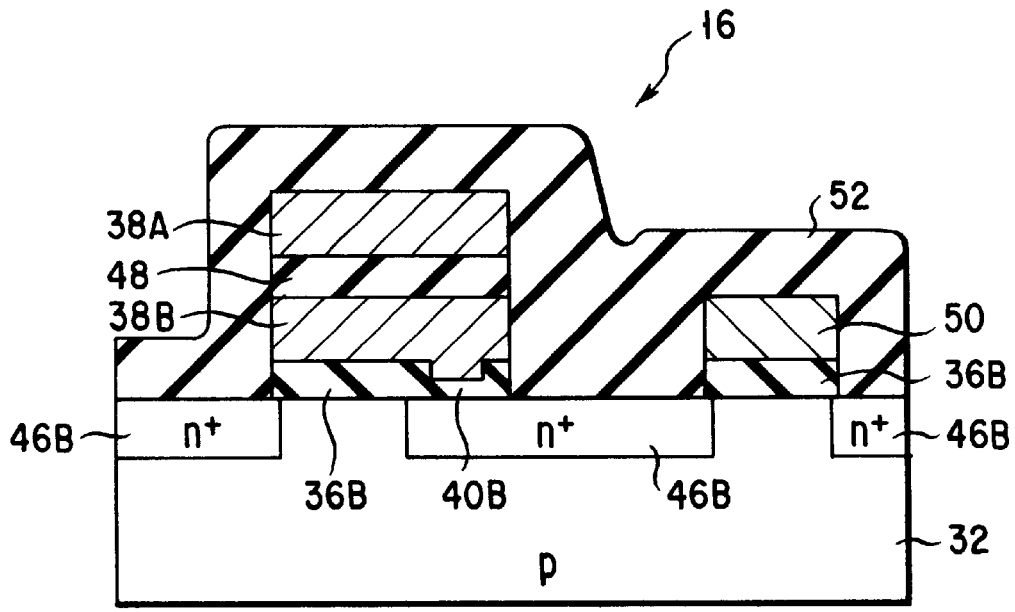
FIG. 7 is a cross-sectional view illustrating the structure of the EEPROM.

FIG. 7 is a cross-sectional view simply showing the structure of one memory cell of the EEPROM 16.

As shown in FIG. 7, n-type diffusion regions 46B serving as source and drain regions are formed in the p-type Si semiconductor substrate 32. A tunnel insulation film 40B having a thickness of about 100 Å is formed between the source and drain regions, as is a gate insulation film 36B having a thickness of about 400 Å. A floating gate (FG) 38B of a polysilicon pattern is formed on the tunnel insulation film 40B and gate insulation film 36B. An insulation film 48 is provided on the floating gate (FG) 38B, and a control gate (CG) 38A is formed on the insulation film 48.

Another gate insulation film 36B having a thickness of about 400 Å is formed between other source and drain regions. A select gate (SG) 50 is provided on the gate insulation film 36B. An insulation film 52 is formed on the entire surface of the p-type Si semiconductor substrate 32. The gate insulation film 36B and tunnel insulation film 40B are constituted of, e.g., an oxide film, an oxynitride film, and the like.

As the gate insulation film 36B of one of memory cells constituting the EEPROM 16, the insulation film 36 of the security circuit 20 is used in a high voltage MOS transistor and formed to have a thickness of about 400 Å. Furthermore, as the tunnel insulation film 40B used for performing write and erase operations in the memory cell of the EEPROM 16, the tunnel insulation film 40 in the insulation film 36 is formed to have a thickness of about 100 Å.

Furthermore, a gate insulation film 36A in another block including the test circuit 18 and MPU 12 is formed to have a thickness of about 200 Å and used mainly in the 5V MOS transistor.

Figure 8:
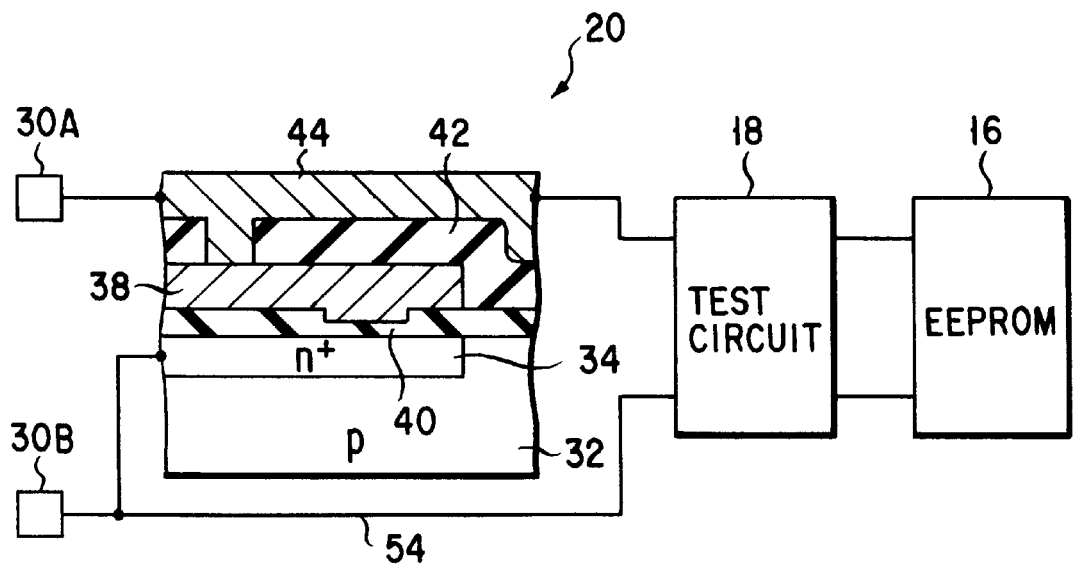
FIG. 8 is a block diagram of the electrical arrangement of the chip and a cross-sectional view of the security circuit of the chip.

FIG. 8 illustrates the security circuit 20 whose block diagram, shown in FIG. 4, is replaced with the sectional view shown in FIG. 5.

Referring to FIG. 8, the testing pad 30A is connected to the input section of power supply voltage of the test circuit 18 through the wiring layer 44 of the security circuit 20, and the output section of power supply voltage of the test circuit 18 is connected to the input section of power supply voltage of the EEPROM 16. The power supply voltage inputs to the testing pad 30A and then applied to the wiring layer 44, test circuit 18 and EEPROM 16.

The testing pad 30B is connected to the input section of reference voltage VSS of the test circuit 18 through a wiring 54 different from the wiring layer 44, and the output section of reference voltage VSS of the test circuit 18 is connected to the input section of reference voltage VSS of the EEPROM 16. The reference voltage VSS is input to the testing pad 30B and applied to the wiring 54, test circuit 18 and EEPROM 16.

The polysilicon pattern 38 is connected to the wiring layer 44, and the n-type diffusion layer 34 is connected to the wiring 54. The tunnel insulation film 40 having a thickness of about 100 Å is formed between the polysilicon pattern 38 and n-type diffusion region 34.

Figure 9:
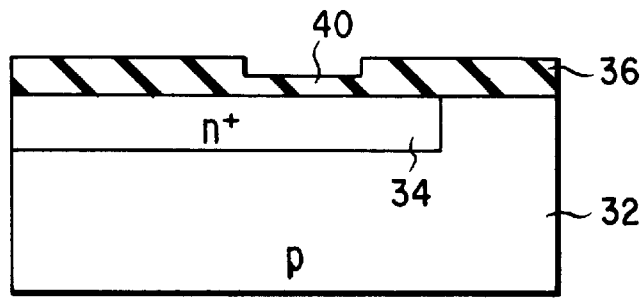
FIG. 9 is a cross-sectional view showing a process of manufacturing the security circuit.
Figure 10:
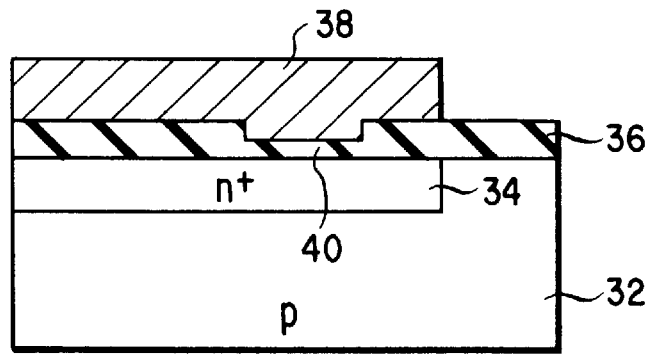
FIG. 10 is a cross-sectional view showing a process of manufacturing the security circuit.

FIGS. 5, 9 and 10 are cross-sectional views illustrating a method for manufacturing the security circuit 20.

Referring first to FIG. 9, an n-type diffusion region 34 whose sheet resistance is 1 k$\Omega$/□, is formed in a p-type Si semiconductor substrate 32, whose resistivity is 10 $\Omega$·cm, and, in this case, the n-type diffusion region 34 is formed under a region where a tunnel insulation film 40 is to be formed. To form the n-type diffusion region 34, phosphorus (P) or arsenic (As) is ion-implanted into the p-type Si semiconductor substrate 32, and heat treatment is carried out.

Subsequently, a gate insulation film 36 having a thickness of about 400 Å used for a high voltage (20 V) MOS transistor and a tunnel insulation film 40 having a thickness of about 100 Å are formed, the gate insulation film in sequence by the normal stacking oxidation. The gate insulation film 36 and tunnel insulation film 40 are formed in the same process as that of forming the gate insulation film 36B and tunnel insulation film 40B of the EEPROM 16.

Thereafter, as shown in FIG. 10, a polysilicon film having a thickness of 0.4 $\mu$m is deposited on the tunnel insulation film 40 and gate insulation film 36. Phosphorus (P) is doped into the polysilicon film whose the sheet resistance is set to 20–50 $\Omega$/□. The polysilicon film also serves as an electrode material for the floating gate (FG) 38B of the EEPROM 16.

After that, the polysilicon film is patterned by RIE to form a polysilicon pattern 38 on the tunnel insulation film 40 and gate insulation film 36. At the same time, the floating gate (FG) 38B is formed. Moreover, n+ and p+ diffusion regions, whose sheet resistances are 20 $\Omega$/□ and 80 $\Omega$/□ and which serve as source and drain regions of the MOS transistor and EEPROM (not shown), are formed.

As illustrated in FIG. 5, an interlayer insulation film 42 is formed above the p-type Si semiconductor substrate 32 to open a contact portion. Furthermore, an Al film is deposited on the interlayer insulation film 42. Then, the Al film is patterned to form a wiring layer 44, and the respective blocks and elements are connected to each other.

Through the process described above, as shown in FIG. 8, the security circuit 20 is formed between the testing pads 30A and 30B and the test circuit 18. As described above, the security circuit can be formed by the same process as that of forming the EEPROM 16 on the chip 8, the test circuit 18 and the other circuits.

An operation of the semiconductor device (chip), according to the embodiment of the present invention, will now be described. When the function and stored information of the EEPROM 16 are tested, the chip 8 performs the following operation.

First a power supply voltage of 5 V and a reference voltage of 0 V are applied from the testing pads 30A and 30B, respectively and testing signals are input to/output from testing pads 30X, 30Y, . . . to operate the test circuit 18 to test the function and stored information of the EEPROM 16. At this time, an electric field of 5 MV/cm is applied to the tunnel insulation film 40 formed between the n-type diffusion layer 34 and polysilicon pattern 38 of the security circuit 20. However, the tunnel insulation film 40 is not broken during the test for the EEPROM by such an electric field.

After the function and stored information of the EEPROM 16 are tested, a voltage of for example 14 V, which is higher than that at the time of the test and not lower than the minimum one necessary for breaking the tunnel insulation film 40, is applied from the testing pad 30A. A considerably stronger electric field of 14 MV/cm is applied to the tunnel insulation film 40 and thus the film 40 is broken immediately and the n-type diffusion region 34 and polysilicon pattern 38 are made in a conductive state. If the thickness and material of the tunnel insulation film 40 are varied, the voltage at which it is broken can be changed and so can be the voltage applied from the testing pad 30A.

Even though a power supply voltage of 5 V and a reference voltage of 0 V are applied from the testing pads 30A and 30B, respectively in order to operate the test circuit 18 using another testing pad, the circuit 18 cannot be done because the polysilicon pattern 38 connected to the testing pad 30A and the n-type diffusion region 34 connected to the testing pad 30B are set in the conductive state. Thus, information cannot be read out of or written to the EEPROM 16 using the testing pads 30A and 30B and test circuit 18.

When a voltage of 14 V is applied to the gate insulation film 36 which is formed to have a thickness of about 200 Å and used for the 5V MOS transistor, the electric field of 7 MV/cm is applied thereto. However, the gate insulation films 36A and 36B are not broken by the electric field of 7 MV/cm.

As described above, according to the embodiment of the present invention, before an IC card is supplied to a user, the tunnel insulation film, by which the wiring supplied with the power supply voltage VDD and the wiring supplied with the reference voltage VSS in the security circuit 20 are insulated from each other, is broken after the function and stored information of the EEPROM are tested. Thus, information can be prevented from being illegally read from or written to the EEPROM by operating the test circuit through the testing pads.

In the foregoing embodiment, as shown in FIG. 8, the security circuit 20 is interposed between the testing pads 30A and 30B and the test circuit 18. The present invention is not limited to this. A wiring path can be provided to connect the test circuit 18 and EEPROM 16. Furthermore, in the above embodiment, a medium, in which information is stored, is explained as the EEPROM. The present invention is not limited to this. A ROM, an EPROM and the other semiconductor memories can be employed as the medium.

A modification to the semiconductor device (chip) according to the above embodiment of the present invention will now be described.

Figure 11:
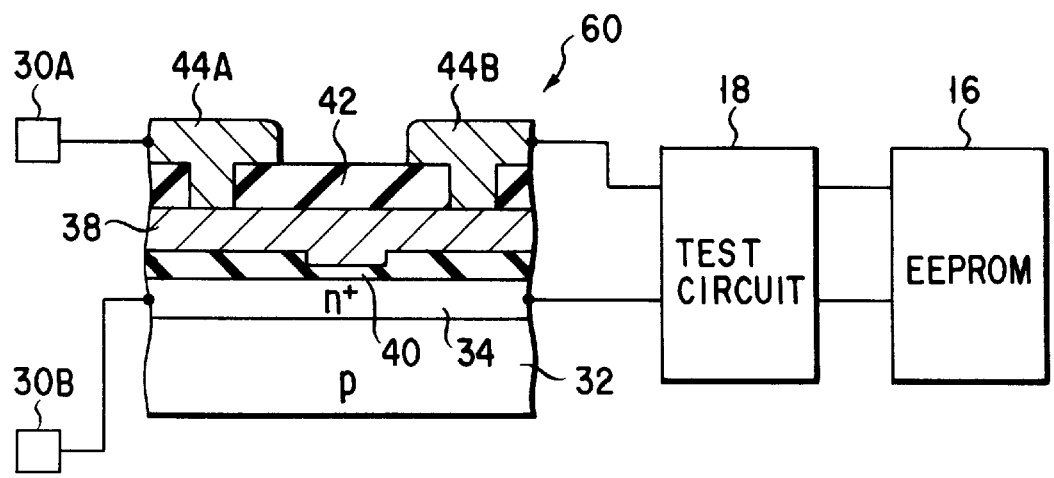
FIG. 11 is a block diagram of the electrical arrangement of a chip of a modification to the embodiment of the present invention and a cross-sectional view of a security circuit of the chip.

FIG. 11 is a block diagram showing the electrical arrangement of the modification of the chip including a cross-sectional view of a security circuit 60.

Referring to FIG. 11, a testing pad 30A is connected to an input section of power supply voltage of a test circuit 18 through a wiring layer 44A, a polysilicon pattern 38, and a wiring layer 44B of the security circuit 60. An output section of power supply voltage of the test circuit 18 is connected to an input section of power supply voltage of the EEPROM 16. The power supply voltage inputs to the testing pad 30A and then applied to the wiring layer 44A, polysilicon pattern 38, wiring layer 44B, test circuit 18, and EEPROM 16.

A testing pad 30B is connected to an input section of reference voltage VSS of the test circuit 18 through an n-type diffusion layer 34 of the security circuit 60. An output section of reference voltage VSS of the test circuit 18 is connected to an input section of reference voltage VSS of the EEPROM 16. The reference voltage VSS inputs to the testing pad 30B and then is applied to the n-type diffusion region 34, test circuit 18 and EEPROM 16.

A tunnel insulation film 40 having a thickness of about 100 Å is formed between the polysilicon pattern 38 and n-type diffusion region 34. The other constitution is the same as that of the above embodiment.

An chip operation of the modification will now be described. When the function and stored information of the EEPROM 16 are tested, the chip 8, so constituted, performs the following operation as in the above embodiment.

First a power supply voltage of 5 V and a reference voltage of 0 V are applied from the testing pads 30A and 30B, respectively and testing signals input to/output from testing pads 30X, 30Y, . . . to operate the test circuit 18 to test the function and stored information of the EEPROM 16. At this time, an electric field of 5 MV/cm is applied to the tunnel insulation film 40 formed between the n-type diffusion layer 34 and polysilicon pattern 38 of the security circuit 60. However, the tunnel insulation film 40 is not broken during the test for the EEPROM by such an electric field.

After the function and stored information of the EEPROM 16 are tested, a voltage of for example 14 V, which is higher than that at the time of the test and not lower than the minimum one necessary for breaking the tunnel insulation film 40, is applied from the testing pad 30A. A considerably stronger electric field of 14 MV/cm is applied to the tunnel insulation film 40 and thus the film 40 is broken immediately and the n-type diffusion region 34 and polysilicon pattern 38 are made in a conductive state. If the thickness and material of the tunnel insulation film 40 are varied, the voltage at which it is broken can be changed and so can be the voltage applied from the testing pad 30A.

Even though a power supply voltage of 5 V and a reference voltage of 0 V are applied from the testing pads 30A and 30B, respectively in order to operate the test circuit 18 using another testing pad, the circuit 18 cannot be done because the polysilicon pattern 38 connected to the testing pad 30A and the n-type diffusion region 34 connected to the testing pad 30B are set in the conductive state. Thus, information cannot be read out of or written to the EEPROM 16 using the testing pads 30A and 30B and test circuit 18.

When a voltage of 14 V is applied to the gate insulation film 36 which is formed to have a thickness of about 200 Å and used for the 5 V MOS transistor, the electric field of 7 MV/cm is applied thereto. However, the gate insulation films 36A and 36B are not broken by the electric field of 7 MV/cm.

As described above, according to the embodiment of the present invention, before an IC card is supplied to a user, the transistor insulation film, by which the wiring supplied with the power supply voltage VDD and the wiring supplied with the reference voltage VSS in the security circuit 60 are insulated from each other, is broken after the function and stored information of the EEPROM are tested. Thus, information can be prevented from being illegally read from or written to the EEPROM by operating the test circuit through the testing pads.

In the foregoing embodiment, as shown in FIG. 11, the security circuit 60 is interposed between the testing pads 30A and 30B and the test circuit 18. The present invention is not limited to this. A wiring path can be provided to connect the test circuit 18 and EEPROM 16. Furthermore, in the above modification, a medium, in which information is stored, is explained as the EEPROM. The present invention is not limited to this. A ROM, an EPROM and the other semiconductor memories can be employed as the medium.

According to the present invention as described above, there can be provided a semiconductor device which prevents information from illegally read from/written to a semiconductor memory by shortening a power supply voltage applying wire and a reference voltage applying wire, which are connected from a testing pad to the semiconductor memory through a test circuit, after the test for the function and stored information of the semiconductor memory is completed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:
   a semiconductor memory having a function of storing information;
   test means for reading/writing information from/to the semiconductor memory to test a function and stored information of the semiconductor memory;
   a power supply voltage applying wire for applying a power supply voltage to the semiconductor memory and the test means;
   a reference voltage applying wire for applying a reference voltage to the semiconductor memory and the test means; and
   security means interposed between the power supply voltage applying wire and the reference voltage applying wire, for shortening the power supply voltage applying wire and the reference voltage applying wire when a voltage applied between the power supply voltage applying wire and the reference voltage applying wire is not lower than a predetermined voltage.

2. The semiconductor device according to claim 1, wherein the predetermined voltage is higher than a normal voltage necessary for testing the function and stored information of the semiconductor memory.

3. The semiconductor device according to claim 1, wherein the semiconductor memory is an EEPROM.

4. The semiconductor device according to claim 1, wherein the semiconductor memory includes a memory cell having a tunnel insulation film and the security means has a tunnel insulation film, both the tunnel insulation films being formed by a common manufacturing process.

5. The semiconductor device according to claim 1, wherein the semiconductor memory, the test means and the security means are manufactured by a common manufacturing process.

6. A semiconductor device comprising:
   a semiconductor memory having a function of storing information;
   test means for reading/writing information from/to the semiconductor memory to test a function and stored information of the semiconductor memory;
   a power supply voltage applying wire for applying a power supply voltage to the semiconductor memory and the test means;
   a reference voltage applying wire for applying a reference voltage to the semiconductor memory and the test means; and
   security means having a tunnel insulation film between the power supply voltage applying wire and the reference voltage applying wire, for breaking the tunnel insulation film and shortening the power supply voltage applying wire and the reference voltage applying wire when a voltage applied between the power supply voltage applying wire and the reference voltage applying wire is not lower than a predetermined voltage.

7. The semiconductor device according to claim 6, wherein the predetermined voltage is higher than a normal voltage necessary for testing the function and stored information of the semiconductor memory and is a minimum voltage necessary for breaking the tunnel insulation film.

8. The semiconductor device according to claim 6, wherein the tunnel insulation film is formed between a polysilicon film connected to the power supply voltage applying wire and a conductive layer connected to the reference voltage applying wire.

9. The semiconductor device according to claim 8, wherein the conductive layer is a diffusion layer of a second conductivity type formed in a surface region of a semiconductor substrate of a first conductivity type, the tunnel insulation film is formed on the diffusion layer, and the polysilicon film is formed on the tunnel insulation film.

10. The semiconductor device according to claim 6, wherein the tunnel insulation film has a thickness of about 100 Å.

11. The semiconductor device according to claim 10, wherein the tunnel insulation film is one of an oxide film and an oxynitride film.

12. The semiconductor device according to claim 6, wherein the semiconductor memory is an EEPROM.

13. The semiconductor device according to claim 6, wherein the semiconductor memory includes a memory cell having a tunnel insulation film, and the tunnel insulation film of the security means and the tunnel insulation film of the memory cell are formed by a common manufacturing process.

14. The semiconductor device according to claim 6, wherein the semiconductor memory, the test means and the security means are manufactured by a common manufacturing process.

15. A semiconductor device comprising:
   a semiconductor memory having a function of storing information;

a test circuit for reading/writing information from/to the semiconductor memory to test a function and stored information of the semiconductor memory;

a first terminal to which a power supply voltage is applied from outside;

a power supply voltage applying wire connected to the first terminal, for applying the power supply voltage to the semiconductor memory and the test circuit;

a second terminal to which a reference voltage is applied from outside;

a reference voltage applying wire connected to the second terminal, for applying a reference voltage to the semiconductor memory and the test circuit; and a security circuit interposed between the power supply voltage applying wire and the reference voltage applying wire, for shortening the power supply voltage applying wire and the reference voltage applying wire when a voltage applied between the power supply voltage applying wire and the reference voltage applying wire is not lower than a predetermined voltage.

16. The semiconductor device according to claim 15, wherein the predetermined voltage is higher than a normal voltage necessary for testing the function and stored information of the semiconductor memory.

17. The semiconductor device according to claim 15, wherein the semiconductor memory is an EEPROM.

18. The semiconductor device according to claim 15, wherein the semiconductor memory includes a memory cell having a tunnel insulation film and the security circuit has a tunnel insulation film, both the tunnel insulation films being formed by a common manufacturing process.

19. The semiconductor device according to claim 15, wherein the semiconductor memory, the test circuit and the security circuit are manufactured by a common manufacturing process.

20. A semiconductor device comprising:

a semiconductor memory having a function of storing information;

a test circuit for reading/writing information from/to the semiconductor memory to test a function and stored information of the semiconductor memory;

a first terminal to which a power supply voltage is applied from outside;

a power supply voltage applying wire connected to the first terminal, for applying the power supply voltage to the semiconductor memory and the test circuit;

a second terminal to which a reference voltage is applied from outside;

a reference voltage applying wire connected to.the second terminal, for applying a reference voltage to the semiconductor memory and the test circuit; and a security circuit having a tunnel insulation film between the power supply voltage applying wire and the reference voltage applying wire, for breaking the tunnel insulation film and shortening the power supply voltage applying wire and the reference voltage applying wire when a voltage applied between the power supply voltage applying wire and the reference voltage applying wire is not lower than a predetermined voltage.

21. The semiconductor device according to claim 20, wherein the predetermined voltage is higher than a normal voltage necessary for testing the function and stored information of the semiconductor memory and is a minimum voltage necessary for breaking the tunnel insulation film.

22. The semiconductor device according to claim 20, wherein the tunnel insulation film is formed between a polysilicon film connected to the power supply voltage applying wire and a conductive layer connected to the reference voltage applying wire.

23. The semiconductor device according to claim 22, wherein the conductive layer is a diffusion layer of a second conductivity type formed in a surface region of a semiconductor substrate of a first conductivity type, the tunnel insulation film is formed on the diffusion layer, and the polysilicon film is formed on the tunnel insulation film.

24. The semiconductor device according to claim 20, wherein the tunnel insulation film has a thickness of about 100 Å.

25. The semiconductor device according to claim 24, wherein the tunnel insulation film is one of an oxide film and an oxynitride film.

26. The semiconductor device according to claim 20, wherein the semiconductor memory is an EEPROM.

27. The semiconductor device according to claim 20, wherein the semiconductor memory includes a memory cell having a tunnel insulation film, and the tunnel insulation film of the security circuit and the tunnel insulation film of the memory cell are formed by a common manufacturing process.

28. The semiconductor device according to claim 20, wherein the semiconductor memory, the test circuit and the security circuit are manufactured by a common manufacturing process.

* * * * *